(12) United States Patent
Bouche et al.

(10) Patent No.: US 7,180,224 B2
(45) Date of Patent: Feb. 20, 2007

(54) ELECTRONIC COMPONENT HAVING A RESONATOR AND FABRICATION PROCESS

(75) Inventors: Guillaume Bouche, Grenoble (FR); Nick Smears, Saint-Egreve (FR); Pascal Ancey, Revel (FR); Gregory Caruyer, Goncelin (FR)

(73) Assignee: STMicroelectronics S.A., Montrouge (FR)

( * ) Notice: Subject to any disclaimer, the term of this patent is extended or adjusted under 35 U.S.C. 154(b) by 181 days.

(21) Appl. No.: 10/815,472

(22) Filed: Apr. 1, 2004

(65) Prior Publication Data

US 2005/0001698 A1 Jan. 6, 2005

(30) Foreign Application Priority Data

Apr. 1, 2003 (FR) .................................. 03 04039

(51) Int. Cl.
*H01L 41/08* (2006.01)
(52) U.S. Cl. .................... 310/320; 310/312; 310/348; 310/363; 310/365
(58) Field of Classification Search ................ 310/312, 310/320, 348, 363, 365
See application file for complete search history.

(56) References Cited

U.S. PATENT DOCUMENTS 3,569,750 A 3/1971 Beaver et al.
3,760,471 A * 9/1973 Borner .................... 29/25.35
6,483,229 B2 * 11/2002 Larson et al. ............... 310/348
6,874,211 B2 * 4/2005 Bradley et al. ............ 29/25.35
6,927,651 B2 * 8/2005 Larson et al. ............... 333/189
2002/0089395 A1 7/2002 Ella et al. ................... 333/189
2002/0118079 A1 8/2002 Whatmore et al.
2002/0166218 A1 * 11/2002 Barber ..................... 29/25.35
2004/0017271 A1 * 1/2004 Philliber et al. ............ 333/187
2004/0130847 A1 * 7/2004 Aigner et al. ............... 361/160
2005/0128030 A1 * 6/2005 Larson et al. ............... 333/191

FOREIGN PATENT DOCUMENTS

EP 1 058 383 12/2000

OTHER PUBLICATIONS

K.M. Lakin et al., "Filter Banks Implemented With Integrated Thin Film Resonators", 2000 IEEE Ultrasonics Symposium, vol. 1, Oct. 22, 2000, pp. 851-854, XP010541720.
French Preliminary Search Report dated Dec. 19, 2003 for French Application No. 03 04039.

* cited by examiner

*Primary Examiner*—Thomas M. Dougherty
(74) *Attorney, Agent, or Firm*—Lisa K. Jorgenson; Jose Gutman; Fleit, Kain, Gibbons, Gutman, Bongini & Bianco P.L.

(57) ABSTRACT

An electronic component (1) includes a substrate (2) and at least two piezoelectric resonators (3, 4) each having an active element (6, 9), a lower electrode (5, 8) and an upper electrode (7, 10). The lower electrode (5) of the first resonator (3) is made of a material that is different from that of the lower electrode (8) of the second resonator (4) such that the resonators exhibit different resonance frequencies.

12 Claims, 2 Drawing Sheets

ELECTRONIC COMPONENT HAVING A RESONATOR AND FABRICATION PROCESS

CROSS-REFERENCE TO RELATED APPLICATION

This application is based upon and claims priority from prior French Patent Application No. 03 04039, filed on Apr. 1, 2003, the entire disclosure of which is herein incorporated by reference.

BACKGROUND OF THE INVENTION

1. Field of the Invention

The invention relates to the field of circuits and microsystems having one or more piezoelectric and/or acoustic resonators.

2. Description of the Related Art

Such circuits may be used as filters in mobile telephony applications. A noise-contaminated signal is applied to the upper electrode. A filtered signal centered on the resonance frequency of the resonator is retrieved on the lower electrode. This frequency is determined directly by the thickness of a piezoelectric film included between the two electrodes. A combination of resonators can be used to form a filter function. The resonator is used as a high-Q filter element.

The resonators are securely attached to the integrated circuit while being acoustically or mechanically isolated with respect to the latter. To this end, a support capable of providing such isolation may be envisaged. The support may comprise, alternately, high acoustic impedance layers and low acoustic impedance layers. The support may comprise a suspended membrane.

The actual resonator comprises an active element formed of piezoelectric material placed between two electrodes. The resonance frequency of the resonator depends essentially on the thickness of the piezoelectric material, on its mechanical properties and on the mechanical properties of the electrodes. Resonators may be interconnected in various configurations to produce filters. The center frequency of such combinations depends on the resonance frequency of each of the resonators forming them.

The U.S. Document 2002/0089395 describes resonators mounted on one and the same substrate and having different resonance frequencies due to different thicknesses of the piezoelectric material of the active elements.

A need is apparent for resonators mounted on the same substrate and exhibiting resonance frequencies that are markedly different, for example 900 MHz and 1800 MHz.

Accordingly, there exists a need for overcoming the disadvantages of the prior art as discussed above.

SUMMARY OF THE INVENTION

The invention proposes resonators exhibiting markedly different resonance frequencies and mounted on the same support, while remaining simple and economic to fabricate.

The invention proposes a component having a substrate and at least two piezoelectric resonators, each provided with an active element. The resonators can exhibit resonance frequencies that differ by more than 10%.

Each resonator includes a lower electrode, an active element and an upper electrode. The lower electrode of a first resonator is made of material that is different from that of the lower electrode of a second resonator. Thus it is possible to achieve resonance frequencies that are considerably different, while keeping electrode thicknesses relatively similar, which facilitates fabrication.

The lower electrode of a first resonator may have a thickness that is different from that of a second resonator. The lower electrode is generally fixed on or in the substrate.

In one embodiment of the invention, the upper electrode of a first resonator is made of a material that is different from that of the upper electrode of a second resonator. Here also, a marked difference between the resonance frequencies of the resonators is facilitated. The upper electrode of the first resonator may have a thickness that is different from that of the upper electrode of the second resonator.

In one embodiment of the invention, the active element of a first resonator is made of a material that is different from that of the active element of a second resonator. Here also, the differentiation between the resonance frequencies of the resonators is facilitated. The thickness of the active element of the first resonator may be different from that of the active element of the second resonator.

In one embodiment of the invention, the component includes three resonators exhibiting resonance frequencies belonging to three different frequency bands, for example 900 MHz, 1800 MHz and 2100 MHz.

In another embodiment, the component includes four resonators exhibiting resonance frequencies belonging to four different frequency bands.

In one embodiment of the invention, the electrodes are made of a material chosen from aluminum, copper, molybdenum, nickel, titanium, niobium, silver, gold, tantalum, lanthanum, tungsten and platinum.

In one embodiment of the invention, the active element includes crystalline aluminum nitride, zinc oxide, zinc sulphide, and/or ceramic including $LiTaO_3$, $LiNbO_3$, $PbTiO_3$, $KNbO_3$, $PbZrTiO_3$ and/or lanthanum.

The active element may have a thickness of between 0.5 and 5 μm, preferably between 1 and 3 μm.

The electrodes may have a thickness of less than 1 μm, preferably less than 0.3 μm.

The resonator can be of discrete, hybrid or integrated type. A filter may advantageously include one or more resonators.

The invention also proposes a process for fabricating a component, in which process at least two piezoelectric resonators are formed on a substrate. Each resonator is provided with an active element, such that the resonators exhibit resonance frequencies that differ by more than 10%.

Advantageously, the lower electrode of a first resonator is made of a material that is different from that of the lower electrode of a second resonator. By keeping the electrode thicknesses similar, which facilitates fabrication, it is thus possible to obtain considerably different resonant frequencies.

BRIEF DESCRIPTION OF THE DRAWINGS

The present invention will be better understood by reading the detailed description of a few embodiments given by way of examples that are not at all limiting and illustrated by the accompanying drawings in which.

DETAILED DESCRIPTION

Figure 1:
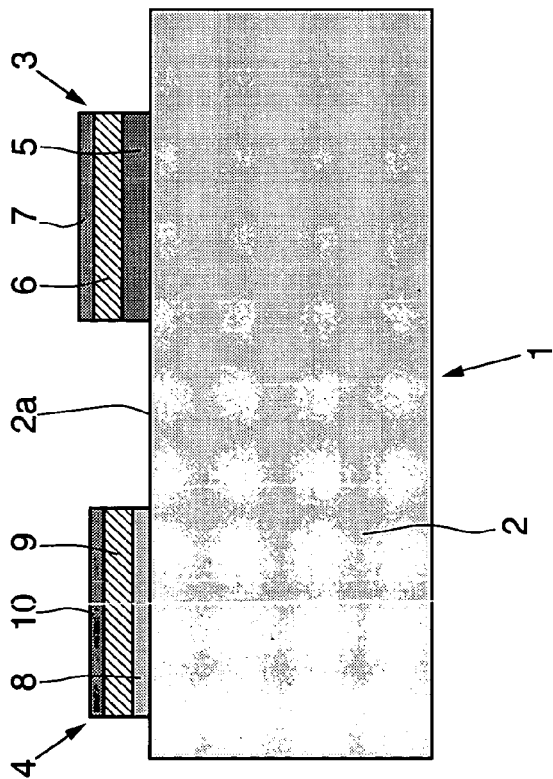
FIG. 1 is a schematic view in section of an integrated circuit according to one embodiment of the invention.

As FIG. 1 shows, a component 1 includes a substrate 2, of conventional composition such as silicon, having an upper surface 2a. Two resonators 3 and 4 are placed on the upper surface 2a of the substrate 2. To make the drawing clear, the support of the resonator 3 has not been represented. The support can be formed in the substrate 2. The resonator 3 includes a lower electrode 5, in contact with the upper surface 2a of the substrate 2, a piezoelectric active element 6 placed on the lower electrode 5 and an upper electrode 7 placed on the active element 6. The architecture of the resonator 4 is similar, with a lower electrode 8, a piezoelectric active element 9 and an upper electrode 10.

The lower electrode 5 of the resonator 3 may be made of aluminum, and the same applies for the upper electrodes 7 and 10 of the resonators 3 and 4.

The lower electrode 8 of the resonator 4 may be made of molybdenum. The active elements 6 and 9 may be made of crystalline aluminum nitride, or of zinc oxide, zinc sulphide, etc.

More generally, it is to be understood that the lower electrodes 5 and 8 are made of different materials, the upper electrodes 7 and 10 are made of the same materials and the active elements 6 and 9 are also made of the same materials. The active elements 6 and 9 and the upper electrodes 7 and 10 can therefore be formed during the same fabrication step.

Furthermore, it is to be noted that the upper electrodes 7 and 10 have approximately the same thickness. The same applies for the active elements 6 and 9, which facilitates their fabrication too.

On the other hand, the lower electrodes 5 and 8 have thicknesses that are markedly different, the lower electrode 5 being approximately twice as thick as the lower electrode 8. Such a difference in thickness is not too inconvenient in so far as the electrodes 5 and 8 are the subjects of two separate fabrication steps because of the difference in materials.

Moreover, the difference in thicknesses of the lower electrodes 5 and 8 means that the resonance frequencies of the resonators 3 and 4 can be shifted even more as compared with a variant in which their thicknesses would be identical. Therefore, as a preference, a difference in thicknesses is chosen that causes a frequency shift effect of the resonator along the same lines as the frequency shift due to the difference in materials.

In other words, it is advantageous to fabricate the lower electrode of the high resonance frequency resonator with a material that, at equal thickness, already provides a high resonance frequency, and a material thickness that, for identical materials, already provides a high resonance frequency.

Clearly, the resonators 3 and 4 could be formed on interconnect layers.

Figure 2:
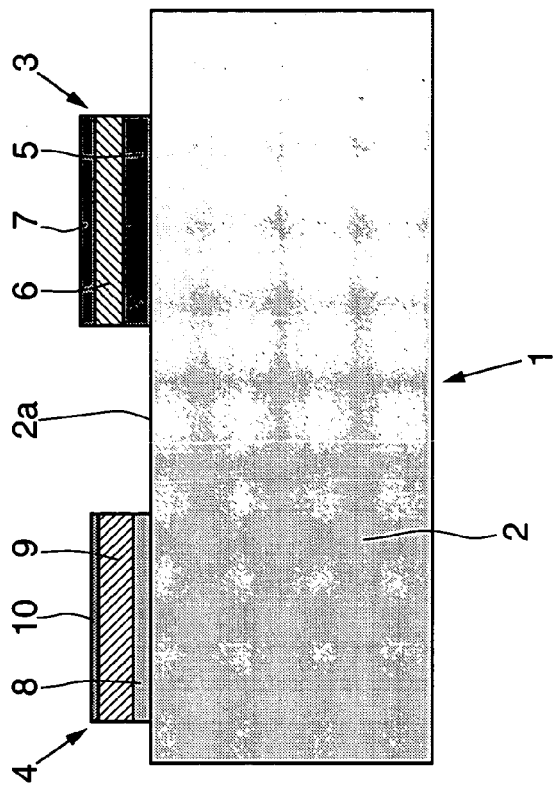
FIGS. 2 and 3 show variants of FIG. 1.

In the embodiment illustrated in FIG. 2, the resonator 3 is identical to that of FIG. 1. The lower electrode 8 of the resonator 4 is also identical to that of FIG. 1. The active element 9 of the resonator 4 is made of a material that is different from that of the active element 6 of the resonator 3 and is thicker. The upper electrode 10 is made of the same material as that of the upper electrode 7 but is not as thick.

Figure 3:
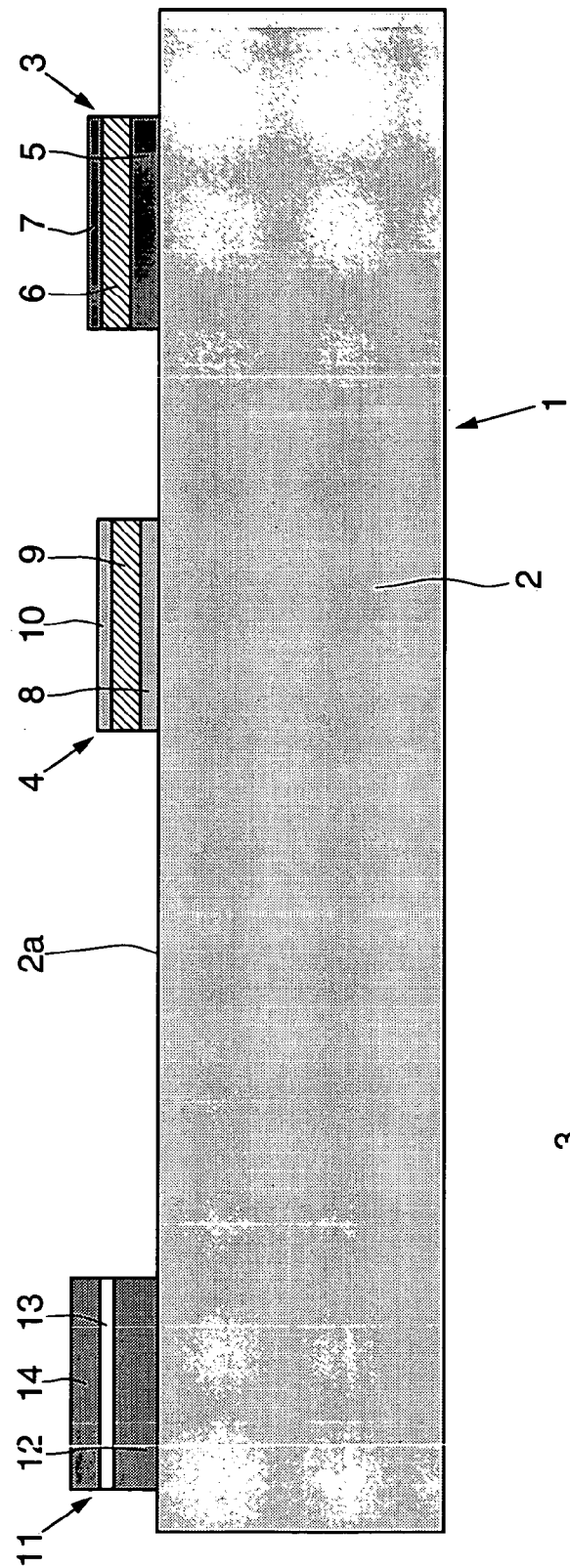

In the embodiment illustrated in FIG. 3, the resonator 3 is identical to that of FIG. 1. The lower electrode 8 and the active element 9 of the resonator 4 are also identical to those of FIG. 1. The upper electrode 10 of the resonator 4 is made of the same material as that of the lower electrode 8 and has a similar thickness to that of the upper electrode 7 of the resonator 3. However a different thickness could be envisaged.

Furthermore, the component includes a third resonator 11 having a lower electrode 12 made of identical material to that of the lower electrode 5 of the resonator 3 and being about 50% thicker. An active element 13 that is not as thick as the active element 6 of the resonator 3 is of different composition, for example based on a ceramic containing rare earths. The upper electrode 14 is of the same composition as that of the upper electrode 7 of the resonator 3, but is approximately twice the thickness. Thus, this results in a substrate having three resonators with three markedly different resonance frequencies, for example 900 MHz, 1800 MHz and 2100 MHz.

One embodiment of the invention proposes to integrate into the same chip, and therefore during fabrication on the same substrate, a plurality of resonators having resonance frequencies that differ by at least 25%, and preferably exhibiting different orders of magnitude. For this purpose, provision is made for a first resonator having a lower electrode made of a first material and a second resonator having a lower electrode made of a second material giving it a second resonance frequency that is different from the first resonance frequency of the first resonator.

As an option, the lower electrodes can be made to have different thicknesses so as to increase the difference between the resonance frequencies of the two resonators. Along the same lines, different materials can be used for the upper electrode, this too leading to an increase in the difference between the resonance frequencies of the two resonators. A difference in thicknesses of the upper electrodes still in the sense of increasing the difference between the resonance frequencies of the two resonators is also advantageous.

It is advantageous to make the provision for different materials for the active elements of the first and second resonators, giving rise to an increase in the difference between the first and second resonance frequencies, as well as to provide for a difference in thickness of the active elements.

By manipulating these various parameters, resonance frequencies ranging from about 1 to 6 GHz, in particular from 0.9 to 5 GHz can be obtained. Of course, two resonators of different resonance frequencies can be incorporated, as shown in FIGS. 1 and 2, or three resonators, as shown in FIG. 3, or even four, or five, resonators having four, or five, different resonance frequencies due to the difference in materials of the lower electrodes and optionally due to the difference in thicknesses of the lower electrodes, and to the difference in materials and/or thicknesses of the active elements and/or of the upper electrodes.

Another embodiment of the invention proposes to incorporate the resonator in a hybrid circuit. The resonator may include a substrate made of glass or based on silicon. The resonator can also be produced in discrete-component form.

The resonator can be attached to a flexible membrane or to a stack of layers forming an acoustic damper, often called an acoustic Bragg mirror by analogy with the Bragg mirror known in the field of optics.

Figure 4:
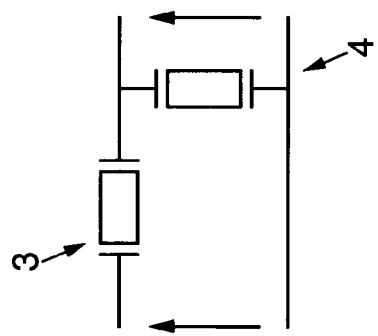
FIG. 4 is a schematic view of a filter according to one aspect of the invention.

To obtain a high-performance filter, as desired in radio communication circuits, a plurality of resonators can be arranged in bridge (or lattice) form or in ladder-network form as illustrated in FIG. 4. The filter 15 includes the resonators 3 and 4 the resonance frequencies of which are slightly offset, producing an excellent selectivity characteristic.

While there has been illustrated and described what is presently considered to be a preferred embodiment of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiment disclosed, but that the invention include all embodiments falling within the scope of the appended claims.

What is claimed is:

1. An electronic component comprising:
a substrate and at least two piezoelectric resonators each having an active element, a lower electrode and an upper electrode, wherein the lower electrode of the first resonator is made of a material that is different from that of the lower electrode of the second resonator such that the resonators exhibit different resonance frequencies, each resonator including a lower electrode, an active element and an upper electrode, the active element of a first resonator being made of a material that is different from that of the active element of a second resonator.

2. The electronic component according to claim 1, wherein the resonance frequencies differ by at least 10%.

3. The electronic component according to claim 1, wherein each resonator includes a lower electrode, an active element and an upper electrode, the lower electrode of a first resonator being of different thickness from that of the lower electrode of a second resonator.

4. The electronic component according to claim 1, wherein each resonator includes a lower electrode, an active element and an upper electrode, the upper electrode of a first resonator being made of a material that is different from that of the upper electrode of a second resonator.

5. The electronic component according to claim 1, wherein each resonator includes a lower electrode, an active element and an upper electrode, the upper electrode of a first resonator being of thickness that is different from that of the upper electrode of a second resonator.

6. The electronic component according to claim 1, wherein each resonator includes a lower electrode, an active element and an upper electrode, the active element of a first resonator being of thickness that is different from that of the active element of a second resonator.

7. The electronic component according to claim 1, wherein it includes at least three resonators exhibiting resonance frequencies belonging to at least three different frequency bands.

8. The electronic component according to claim 1, wherein it includes four resonators exhibiting resonance frequencies belonging to four different frequency bands.

9. The electronic component according to claim 1, wherein the electrodes are made of a material chosen from aluminum, copper, molybdenum, nickel, titanium, niobium, silver, gold, tantalum, lanthanum, platinum and tungsten.

10. The electronic component according to claim 1, wherein the active element includes crystalline aluminum nitride, zinc oxide, zinc sulphide, ceramic including $LiTaO_3$, $LiNbO_3$, $PbTiO_3$, $PbZrTiO_3$, $KNbO_3$ and/or lanthanum.

11. The electronic component according to claim 1, wherein the active element has a thickness of between 0.5 and 5 m.

12. The electronic component according to claim 1, wherein the electrodes have a thickness of less than 1 m.

* * * * *

UNITED STATES PATENT AND TRADEMARK OFFICE
CERTIFICATE OF CORRECTION

| | | |
|---|---|---|
| PATENT NO. | : 7,180,224 B2 | Page 1 of 1 |
| APPLICATION NO. | : 10/815472 | |
| DATED | : February 20, 2007 | |
| INVENTOR(S) | : Guillaume Bouche et al. | |

It is certified that error appears in the above-identified patent and that said Letters Patent is hereby corrected as shown below:

Col. 6, Line 33: Delete "5 m" and replace with -- 5 $\mu$m --.

Col. 6, Line 35: Delete "1 m" and replace with -- 1 $\mu$m --.

Signed and Sealed this

Seventeenth Day of April, 2007

JON W. DUDAS
*Director of the United States Patent and Trademark Office*